United States Patent [19]
Yajima et al.

[11] Patent Number: 5,572,122
[45] Date of Patent: Nov. 5, 1996

[54] APPARATUS INCLUDING A SPECIMEN TILT MECHANISM FOR MEASURING ELECTROMAGNETIC FIELD DISTRIBUTION IN THE SPECIMEN USING A FOCUSED ELECTRON BEAM

[75] Inventors: Yusuke Yajima, Kokubunji; Yoshio Takahashi, Kunitechi; Masakazu Ichikawa, Tokyo; Shigeyuki Hosoki, Hachioji, all of Japan

[73] Assignee: Hitachi, Ltd., Tokyo, Japan

[21] Appl. No.: 141,077

[22] Filed: Oct. 26, 1993

[30] Foreign Application Priority Data

Oct. 26, 1992 [JP] Japan ..................... 4-287438

[51] Int. Cl.$^6$ ..................... G01R 33/02; G01R 33/025
[52] U.S. Cl. ..................... 324/250; 324/262
[58] Field of Search ..................... 324/250, 244, 324/244.1, 262; 250/306, 309, 311, 442.11, 440.11

[56] References Cited

U.S. PATENT DOCUMENTS

| | | | |
|---|---|---|---|
| 3,541,439 | 11/1970 | Shriver | 324/250 X |
| 4,803,430 | 2/1989 | Shinada et al. | 324/250 |
| 5,075,623 | 12/1991 | Matsuda et al. | 324/250 |
| 5,153,434 | 10/1992 | Yajima et al. | 250/311 |
| 5,298,747 | 3/1994 | Ichikawa et al. | 250/306 |
| 5,345,080 | 9/1994 | Yajima et al. | 250/311 |

FOREIGN PATENT DOCUMENTS 674121  7/1979  U.S.S.R. ..................... 324/250

OTHER PUBLICATIONS

Materials Science And Engineering, B3 (1989), "High Resolution Imaging of Magnetic Structures in the Transmission Electron Microscope", J. N. Chapman, pp. 355–358.

The American Physical Society, Physical Review B, vol. 34, No. 5, Sep. 1986, "Holographic Interference Electron Microscopy for Determining Specimen Magnetic Structure and Thickness Distribution", A. Tonomura et al., pp. 3397–3402.

Primary Examiner—Sandra L. O'Shea
Assistant Examiner—Roger Phillips
Attorney, Agent, or Firm—Fay, Sharpe, Beall, Fagan, Minnich & McKee

[57] ABSTRACT

An apparatus for measuring an electromagnetic field distribution using a focused electron beam can measure the electromagnetic field distribution in a specimen with high resolution and high reliability. A focused electron beam radiation system irradiates a specimen with a focused electron beam. A specimen tilt mechanism tilts a specimen by 180° about a tilt axis that is perpendicular to the optical axis of the focused electron beam. An electron beam position detector measures the direction and quantity of the deflection given to the focused electron beam when it is transmitted through the specimen. Further, a processing system calculates the direction and the intensity of an electric field, and the direction and the intensity of a magnetic field separately at a point on the specimen through which the focused electron beam is transmitted, from the data on the direction and the quantity of the deflection of the focused electron beam measured by the electron beam position detector before and after the turnover of the specimen by the specimen tilt mechanism. Thus, an electric field and a magnetic field in a specimen can be separately observed independently of each other.

8 Claims, 2 Drawing Sheets

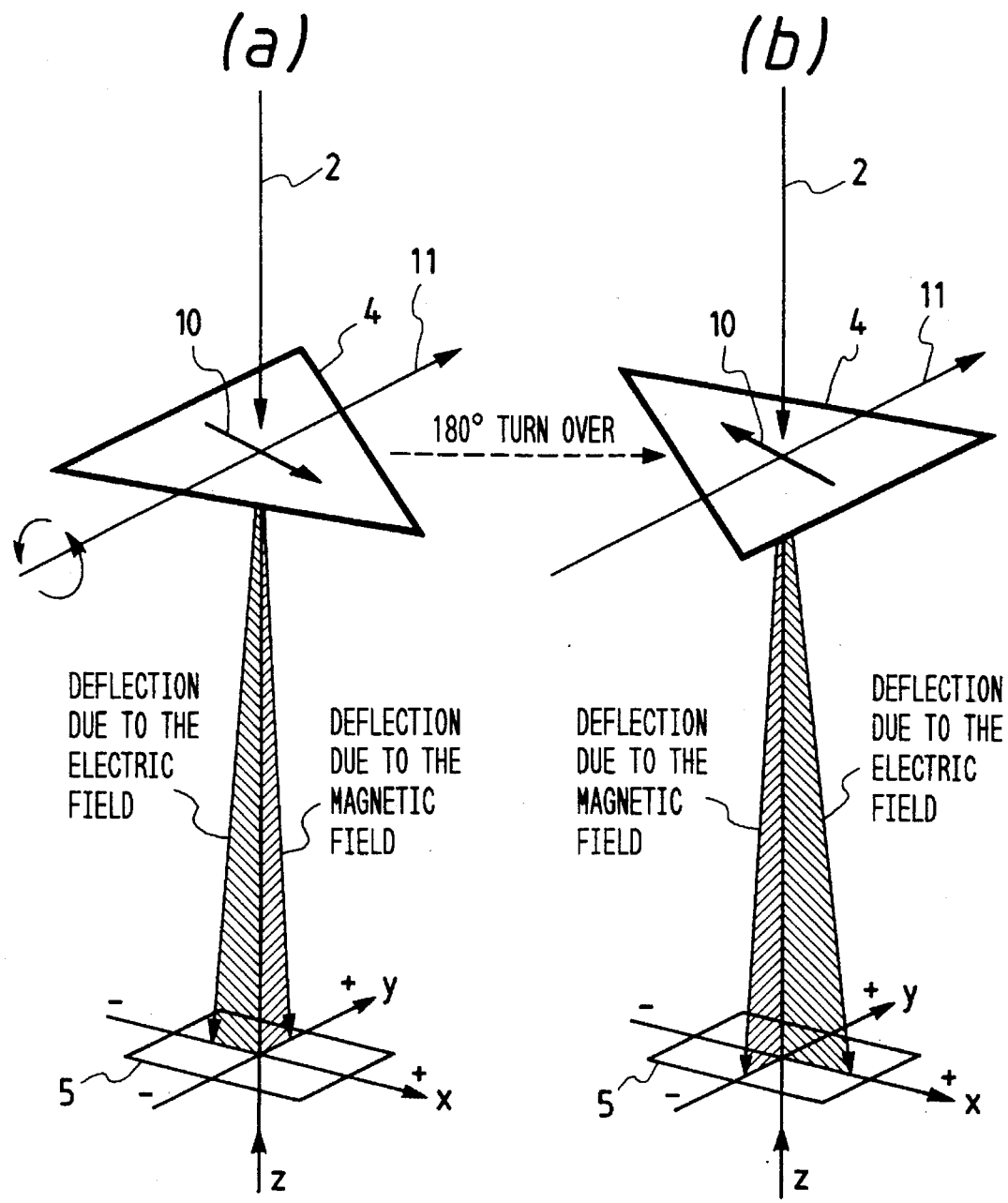

APPARATUS INCLUDING A SPECIMEN TILT MECHANISM FOR MEASURING ELECTROMAGNETIC FIELD DISTRIBUTION IN THE SPECIMEN USING A FOCUSED ELECTRON BEAM

BACKGROUND OF THE INVENTION

The present invention relates to an apparatus for measuring an electromagnetic field distribution using an electron beam as a probe, and in particular, it relates to an apparatus for measuring an electromagnetic field distribution in an extremely small area using a focused electron beam.

A differential phase contrast method for measuring an electromagnetic field distribution in an extremely small area inside a magnetic thin film is known to the public, in which a specimen is irradiated with a focused electron beam and the direction and the magnitude of a deflection (Lorentz deflection) of the beam caused by the magnetic field in the specimen when the beam is transmitted through the specimen is detected by an electron beam position detector. In this method, since an electron beam can be focused to a very fine beam (diameter: in the order of several nanometers), a magnetic field distribution can be measured with a very high resolution by scanning a specimen with the focused electron beam with a high precision. The differential phase contrast method is explained in, for example, *"Materials Science and Engineering, B3, 355–358 (1989)"*.

In an apparatus for measuring a magnetic field distribution using the above-mentioned differential phase contrast method, a deflection phenomenon of an electron beam caused by a magnetic field is utilized, but the deflection of an electron beam is caused by not only a magnetic field but also by an electric field. Therefore, in a case where the influence of an electric field is large, or where a detailed magnetic field distribution is to be investigated without ambiguity, it is necessary to separate the effect of the electric field from that of the magnetic field.

In general, when the direction of incidence of an electron beam onto a specimen is reversed, in the Lorentz force given to an electron beam by an electromagnetic field, the direction of a force due to the electric field is not changed, but the direction of a force due to the magnetic field is reversed. Therefore, it is possible to determine the electric field distribution and the magnetic field distribution separately at a point at which the electron beam is transmitted, by the combined analysis of the direction and the magnitude of deflection of the electron beam caused by the Lorentz force when the electron beam is transmitted through a specimen in one direction, and on the direction and the magnitude of deflection of the electron beam when it is transmitted through the specimen in the opposite direction to the above.

As described, for example, in the Physical Review, B34, 3397–3402 (1986), the separate measurements of an electric field and a magnetic field based on the principle described above is possible. In the above case, after a specimen is observed under a holographic interference microscope which can detect the deflection of an electron beam caused by a Lorentz force, the specimen is taken out of the microscope and turned over, and then it is put back under the microscope again for observation. The separation of the contribution of an electric field from that of a magnetic field is performed by comparing the observation results obtained before and after the turnover of the specimen. In the method as described above, however, a rather long time is needed for the observations, and the observation area may shift between the 2 cases, that is before and after the turnover of the specimen.

Another example of a method for reversing the direction of incidence of an electron beam onto a specimen is to prepare two sets of measuring systems composed of two electron sources and two electron beam position detectors, which are disposed to have opposite directions of incidence of electron beams onto a specimen. In this method, however, the apparatus is necessarily bulky and expensive, and further its operation is complicated; thus, the apparatus cannot be considered practical.

SUMMARY OF THE INVENTION

An object of the present invention is to offer an apparatus for measuring an electromagnetic field distribution with a focused electron beam which is able to measure the electric field distribution and the magnetic field distribution of a specimen separately with a simple method, and to measure the magnetic field distribution of an extremely small area in a specimen with high precision and high reliability.

In the present invention, in order to achieve the above-mentioned object, a set of a measuring system composed of an electron source and an electron beam position detector is used. The measuring system includes mechanism for tilting a specimen by 180° to overturn the specimen with the tilt axis (y axis) being perpendicular to the optical axis (z axis) of the electron beam emitted from the electron source, and also being in-plane with the specimen. Further, the measuring system is prepared to be able to measure a point in a specimen in 2 directions, from the surface and from the back, with an identical electron beam. The direction and the magnitude of the deflection for the optical axis (z axis) of an electron beam which is transmitted through an identical point in the specimen before and after the overturn of the specimen are measured with an electron beam position detector provided under the specimen. Thus, the intensity and the direction of an electric field and those of a magnetic field at the measurement point can be separately measured.

The specimen is scanned with the above-mentioned focused electron beam and the intensity of the transmitted electron beam through the specimen is detected, by which a scanning transmission electron microscope image of the specimen is obtained and displayed. At the same time, the magnitude and the direction of the deflection of the electron beam which is transmitted through respective points of the specimen are detected, and the electromagnetic field distribution in the specimen is obtained and displayed as a scanning image.

Further, when a specimen is turned over, it is sometimes difficult to judge whether the measured points are identical; therefore, to facilitate the judgment, more than three markers are preset inside the observation field of the above-mentioned scanning transmission microscope image, and capable of being clearly confirmed that these points before and after the turnover of the specimen are identical points. A data processor is provided which identifies the measured points before and after the turnover of a specimen, and operates on the electromagnetic field distributions at respective measurement points, outputting the operation results.

The operation of an apparatus having a constitution according to the present invention will be explained in the following. At first, the intensity of an electric field and that of a magnetic field at respective measurement points on the specimen are divided into parallel components (in the y axis direction) parallel to the specimen tilt axis (y axis), and perpendicular components (in the x axis direction), and the influence of deflection forces (Lorentz forces) of respective components on the focused electron beam will be considered.

The directions of the Lorentz forces due to the x axis components (y axis direction) parallel to the specimen tilt axis of an electric field and a magnetic field are explained as follows: The direction of the Lorentz force due to an electric field is parallel (y axis direction) to the specimen tilt axis (y axis), and that due to a magnetic field is perpendicular (x axis direction) to the y axis. The directions of the Lorentz forces due to the components (x axis direction) perpendicular to the specimen tilt axis of an electric field and a magnetic field are explained as follows: The direction of the Lorentz force due to an electric field is perpendicular (x axis direction) to the specimen tilt axis, and that by a magnetic field is parallel (y axis direction) to the specimen tilt axis.

Therefore, the Lorentz force which is parallel (y axis direction) to the specimen tilt axis is the resultant force of a force caused by an electric field component which is parallel to the specimen tilt axis (electric field component in the y axis direction) and a force caused by a magnetic field component which is perpendicular to the specimen tilt axis (magnetic field component in x axis direction). Similarly, the Lorentz force which is perpendicular to the specimen tilt axis (x axis direction) is the resultant force of a force caused by an electric field component perpendicular to the specimen tilt axis (electric field component in x axis direction) and a force caused by a magnetic field component parallel to the specimen tilt axis (magnetic field component in y axis direction).

When the specimen is turned over, the direction of an electric field component parallel to the tilt axis of the specimen (electric field component in y axis direction) is the same before and after the turnover of the specimen, so that in a combined Lorentz force which is generated in the direction of the specimen tilt axis (y axis direction), the direction of a component force caused by an electric field is the same before and after the turnover of the specimen. However, the direction of a component force caused by a magnetic field which is perpendicular to the specimen tilt axis (magnetic field component in x axis direction) is reversed after the turnover of the specimen. Thus, in a combined Lorentz force which is generated in the direction of the specimen tilt axis (y axis direction), the direction of a component force caused by the magnetic field is reversed.

In contrast to this, the direction of an electric field component which is perpendicular to the specimen tilt axis (electric field component in x axis direction) is reversed after the turnover of the specimen, so that in a combined Lorentz force which is perpendicular to the specimen tilt axis (x axis direction), the direction of a component force caused by the electric field is reversed after the turnover of the specimen. However, the direction of a component force caused by a magnetic field component which is parallel to the specimen tilt axis (magnetic field component in y axis direction) is the same before and after the turnover of the specimen, so that in a combined Lorentz force which is generated in the perpendicular direction to the specimen tilt axis (x axis direction), the direction of a component force caused by the magnetic field is the same before and after the turnover of the specimen.

Therefore, when the Lorentz force which is in the direction parallel to the specimen tilt axis (y axis direction) is measured before and after the turnover of the specimen, the Lorentz force component caused by the magnetic field can be separately obtained by finding the difference between the Lorentz force data obtained before and after the turnover of the specimen, and the Lorentz force component caused by the electric field can be separately obtained by finding the summation of the Lorentz force data obtained before and after the turnover of the specimen. Similarly, when the combined Lorentz force which is perpendicular to the specimen tilt axis (x axis direction) is measured before and after the turnover of the specimen, the Lorentz force component caused by an electric field can be separately obtained by finding the difference between the data of the combined Lorentz forces obtained before and after the turnover of the specimen, and the Lorentz force component caused by a magnetic field can be separately obtained by finding the summation of the data of the combined Lorentz forces obtained before and after the turnover of the specimen.

The combined Lorentz force caused by an electromagnetic force can be obtained from the direction and the magnitude deflection of an electron beam which is transmitted through a specimen. The direction and the magnitude of deflection of an electron beam can be measured quantitatively by an electron beam position detector which is provided under the specimen, so that according to the above-mentioned principle, an electric field component and a magnetic field component in respective directions can be separately obtained by measuring the direction and the magnitude of deflection of an electron beam before and after the turnover of a specimen.

The distribution of the electromagnetic field can be displayed as a scanning image together with the scanning transmission electron microscope image of the specimen by scanning the specimen with a focused electron beam. Owing to this, the shape of the specimen and the state of distribution of an electromagnetic field of the specimen can be observed by comparing them.

When markers are provided at more than three positions on a specimen, identification of the positions of measuring points when the specimen is turned over can be made certain by utilizing these markers as reference points. Further, the shape of the specimen and the distribution of an electromagnetic field in the specimen can be automatically observed simultaneously by providing a data processor which identifies the measurement points and operates the electromagnetic field distribution at the measurement points, and outputs the operation results.

BRIEF DESCRIPTION OF THE DRAWINGS

FIG. 2(a) and 2(b) are illustrative views for explaining the principle of the measurement of an electromagnetic field distribution according to the present invention.

DESCRIPTION OF THE PREFERRED EMBODIMENTS

Figure 1:
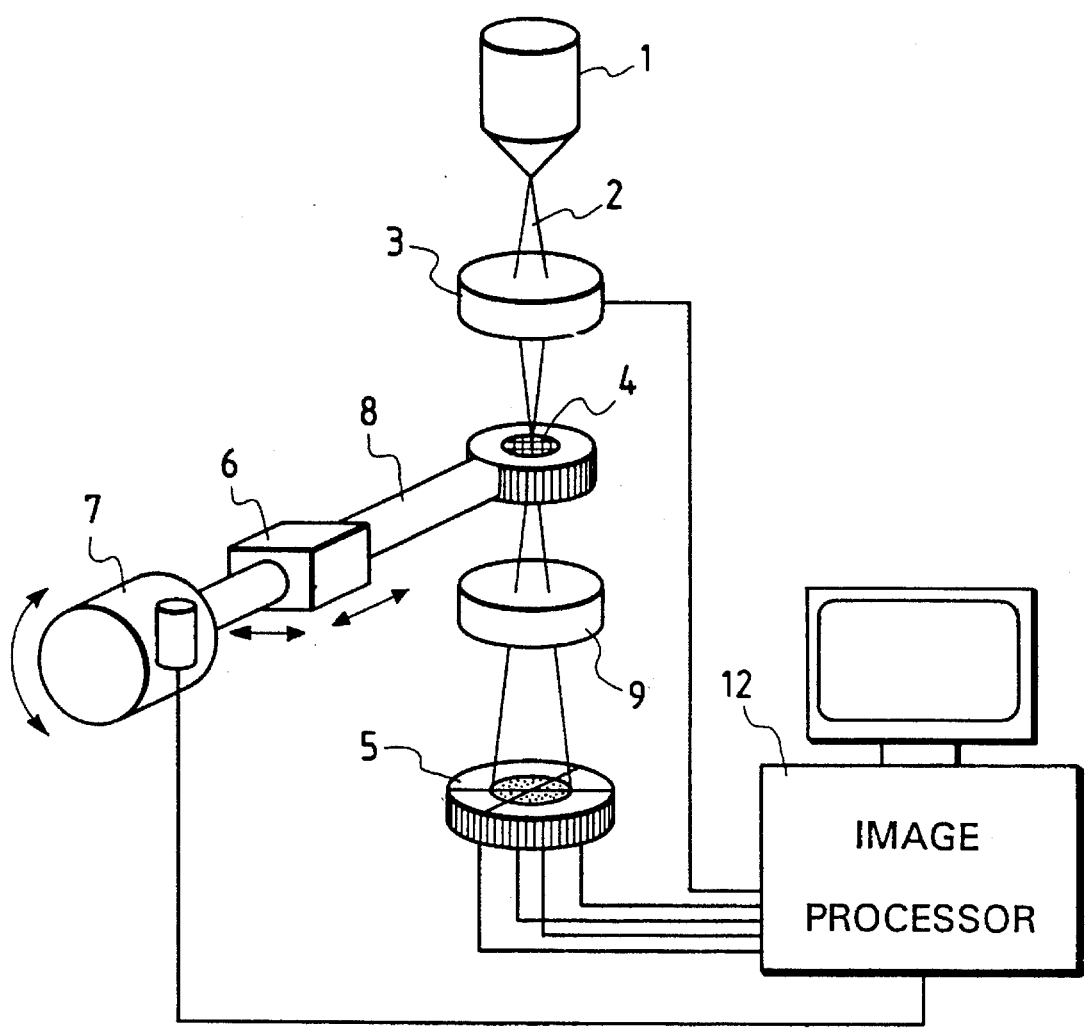
FIG. 1 is a schematic structural view showing an outline of the constitution of an apparatus for measuring an electromagnetic field distribution according to the present invention.

Preferred embodiments according to the present invention will be explained in detail, referring to the drawings in the following description.

FIG. 1 shows an outline of the constitution of an embodiment of an apparatus for measuring an electromagnetic field distribution using a focused electron beam according to the present invention.

In FIG. 1, an electron beam 2 output from an electron source 1, which is composed of an electron gun and an electron accelerating system, is focused on a specimen 4 by an illumination electron optics 3 and used for scanning a specimen. The electron beam 2 is transmitted through the specimen 4 that is composed of a thin film having a thickness through which the electron beam 2 can be transmitted, and reaches a deflection detector 5 through a projection electron optical system 9. Therefore, the apparatus of the present embodiment is substantially a scanning transmission electron microscope (STEM), and a scanning transmission electron microscope image (STEM image) of the specimen 4 can be obtained. The specimen 4 is held with a specimen holder 8, which is provided with a bi-axial image shift mechanism 6 for selecting an observation area and a tilt mechanism 7 that is able to tilt the specimen 4 by 180°. The tilt mechanism 7 is so adjusted that the tilt axis is always positioned in the center of the scanning area on the specimen, and not to let a scanning image being observed go outside the observation area when the specimen 4 is turned over.

The deflection detector 5 to detects the direction and the magnitude of deflection of the electron beam 2 that is transmitted through the specimen 4. In order to realize this function, the present embodiment has a constitution in which, as shown in FIG. 1, four independent detectors are disposed to have respective boundaries that make right angles with each other. When the electron beam 2 is not deflected at all by the specimen 4, the projection electron optical system 9 is so adjusted that even if the specimen 4 is scanned with the electron beam 2, the electron beam 2 is always incident onto the center of the deflection detector 5 (the point of intersection of boundaries of the 4 independent detectors making right angles with each other).

Since the electron beam 2 which is incident onto the deflection detector 5 has a circular profile, the direction and magnitude of the deflection of the electron beam 2 can be obtained by processing the signal intensity of the electron beam 2 distributed to the above-mentioned four independent detectors. Hereinafter the center of the circular profile of the electron beam 2 will be referred to as a deflection point of the electron beam 2. In this place, the deflection detector 5 having four detector portions is used, but it is also possible to use deflection detectors based on other principles, such as a semiconductor position detector or a micro channel plate.

Next, the principle for measuring the intensity of an electric field and the intensity of a magnetic field separately according to the present invention will be explained using FIGS. 2(a) and (b). It is assumed tentatively that an electromagnetic field vector 10 which exists at an observation point on the specimen 4 is perpendicular to the specimen tilt axis 11 as shown in FIG. 2(a). Here, the direction of the electromagnetic field vector 10, the direction of the specimen tilt axis 11, and the direction of a current of the electron beam 2 incident onto the specimen 4 are respectively designated to be the x axis, the y axis, and the z axis. Generally, when the projection electron optical system 9 is constituted with a magnetic lens, the electron beam 2 is rotated about the optical axis, but the quantity of rotation can be completely corrected, so that coordinate axes x, y and z can be set on the deflection detector 5 to the same directions as those on the specimen plane.

In this case, the direction of the deflection of the electron beam 2 is, as shown in FIG. 2(a), in the negative direction of the x axis when the electromagnetic field vector is an electric field vector, and in the positive direction of the y axis when the electromagnetic field vector is a magnetic field vector. Then, when the specimen 4 is turned over about the specimen tilt axis 11, as shown in FIG. 2(b), the direction of the deflection of the electron beam 2 is in the positive direction of the x axis when the electromagnetic field vector 10 is an electric field vector, and when it is a magnetic field vector, the direction of the deflection is in the negative direction of the y axis. When the electromagnetic field vector 10 is parallel to the specimen tilt axis 11, the direction of the deflection of the electron beam 2 is not changed by the turnover of the specimen 4 independent of the kind of the electromagnetic field vector, whether it is an electric field vector or a magnetic field vector.

Therefore, when it is assumed that the deflection points of the electron beam 2 on the detection plane of the deflection detector 5 before and after the turnover of the specimen are respectively (X1, Y1) and (X2, Y2), the components of an electric field and a magnetic field, Ex, Ey and Bx, By, being in-plane with the specimen are as shown below:

$$Ex=e(-X1+X2), Ey=e(-Y1-Y2), Bx=b(+Y1-Y2), By=b(-X1-X2), \quad (1)$$

where e and b are positive integers, which can be found by measuring a standard specimen of which the magnitude of the electromagnetic field is known. When the electromagnetic field vector 10 is 0, the deflection point of the electron beam 2 is positioned at the origin (X=0, Y=0).

As described above, in the present invention, the deflection points of the electron beam 2 which is transmitted through the same observation point on the specimen from opposite directions are compared by comparing the scanning images of the specimen before and after it is turned over. Therefore, the identification of the observation points in the scanning image before and after the turnover of the specimen has to be performed with certainty. Actually, however, various kinds of position corrections are needed because of such problems as the failure to find a distinct constitutional feature in the objective observation area, insufficient tilting precision of the specimen 4, or distortion in the scanning image. In the present embodiment, an observation point correction procedure as shown below is performed by an image processor 12.

At least three markers which can be confirmed to be identical points respectively before and after the turnover of the specimen will be provided on the specimen 4 inside the observation area of the scanning image. A micro grid for holding a thin film specimen, a part having a distinct shape in the thin film specimen itself, etc. can be used as markers. Alternatively, before the specimen is turned over, three points which do not interfere with the observation will be selected in the desired observation area, and these points will be irradiated for a proper duration of time with the electron beam 2 to form deposit spots at the selected points; these spots can be utilized as markers.

A method for identifying the observation points in a scanning image before and after the turnover of a specimen using these markers will be explained. Let the coordinates of these markers before the turnover of the specimen be (x1, y1), (x2, y2) and (x3, y3), and let those after the turnover of the specimen be (xa, ya), (xb, yb) and (xc, yc) in the same order. Let the coordinates of an arbitrary point on the scanning image before the turnover of the specimen be (x, y), and let those of the point after the turnover of the specimen be (xi, yi). Then (xi, yi) can be expressed using the coordinates of the markers as shown below:

$$xi=xc+A(x-x3)+B(y-y3), \text{ and, } yi=yc+C(x-x3)+D(y-y3), \quad (2)$$

and, $$x\alpha=x1-x3, y\alpha=y1-y3, x\beta=x2-x3, y\beta=y2-y3, x\gamma=xa-xc, y\gamma=ya-yc, x\delta=xb-xc, y\delta=yb-yc, \quad (3)$$

$$E=(x\alpha \cdot y\beta - y\alpha \cdot x\beta)(y\alpha \cdot x\beta - x\alpha \cdot y\beta). \quad (4)$$

thus, $$A=\{x\gamma(y\alpha \cdot x\beta \cdot y\beta - x\alpha \cdot y\beta^2) + x\delta(x\alpha \cdot y\alpha \cdot y\beta - y\alpha^2 \cdot x\beta)\}/E,$$

$$B=\{x\gamma(x\alpha \cdot x\beta \cdot y\beta - y\alpha \cdot x\beta^2) + x\delta(x\alpha \cdot y\alpha \cdot x\beta - x\alpha^2 \cdot y\beta)\}/E,$$

$$C=\{y\gamma(-y\alpha \cdot x\beta \cdot y\beta - x\alpha \cdot y\beta^2) + y\delta(x\alpha \cdot y\alpha \cdot y\beta + y\alpha^2 \cdot x\beta)\}/E,$$

$$D=\{y\gamma(x\alpha \cdot x\beta \cdot y\beta + y\alpha \cdot x\beta^2) + y\delta(-x\alpha \cdot y\alpha \cdot x\beta - x\alpha^2 \cdot y\beta)\}/E. \quad (5)$$

As described above, the identification of the measurement points before and after the turnover of the specimen 4 can be automatically performed. The intensity of an electric field and the intensity of a magnetic field at a measuring point can be separately obtained; in the present embodiment, all kinds of operation are performed by the image processor 12, and the results, together with the scanning transmission electron microscope image of the specimen, are displayed by image display methods such as the vectorial plots of the electric field and the magnetic field, the contour plots of intensity, and the gray scale presentation of each component.

As explained in the above, in an apparatus for measuring an electromagnetic field distribution using a focused electron beam according to the present invention, it is possible to measure the distribution of an electric field and the distribution of a magnetic field separately in an extremely small area without ambiguity, and the states of respective distributions, together with a scanning transmission electron microscope image having a high resolution, are visualized and displayed.

What is claimed is:

1. An apparatus for measuring an electromagnetic field distribution in an area on a specimen using a focused electron beam, comprising:

a specimen tilt mechanism for tilting a specimen by 180° about a tilt axis that is perpendicular to the optical axis of said focused electron beam, so as to turn the specimen over;

an electron beam position detector for receiving said focused electron beam after said focused electron beam has transmitted through the same measuring point on the specimen before and after the turnover of the specimen, and for measuring the direction and magnitude of deflection of the optical axis of said focused electron beam before and after the turnover; and means for analyzing the direction and magnitude of deflection measured by said electron beam position detector to determine the direction and intensity of an electric field and the direction and intensity of a magnetic field separately at the measuring point.

2. An apparatus as claimed in claim 1, further comprising a scanning transmission electron microscope having scanning means for scanning said specimen with said focused electron beam, measuring means for measuring the intensity of the focused electron beam after the focused electron beam has transmitted through said specimen, and display means for displaying a scanning transmission electron microscope image of the specimen.

3. An apparatus as claimed in claim 1, further comprising:

scanning means for scanning the specimen with said focused electron beam, wherein said electron beam position detector measures the direction and magnitude of deflection of said focused electron beam for said optical axis at respective scanning points; and display means for displaying the electromagnetic field distribution of the specimen as a scanning image derived from the measured direction and magnitude of deflection at the respective scanning points.

4. An apparatus as claimed in claim 2, further comprising:
means for establishing at least three markers for identifying at least three corresponding specimen points before and after the turnover of said specimen, said at least three markers being set on the display screen on which the scanning transmission electron microscope image of said specimen is displayed such that beam intensity-measuring points before and after the turnover are identified using said markers as reference points;

wherein said analyzing means includes a data processor for controlling the electric and magnetic field distribution measurement at respective measuring points, and for outputting the field distribution measurement results.

5. An apparatus for measuring an electromagnetic field distribution of a specimen using a focused electron beam, comprising:

a focused electron beam radiation means for irradiating a specimen with an electron beam;

a specimen tilt mechanism for tilting said specimen by 180° about a tilt axis that is perpendicular to the optical axis of said focused electron beam, to turn over the specimen;

an electron beam position detector for measuring the direction and magnitude of deflection given to said focused electron beam when it is transmitted through said specimen; and operation means for calculating the direction and intensity of an electric field and the direction and intensity of a magnetic field separately at a point on said specimen through which said focused electron beam is transmitted, from measurement data of the direction and magnitude of the deflection of said focused electron beam measured by said electron beam position detector, said electron beam position detector measuring said direction and magnitude both before and after the turnover of said specimen performed by said specimen tilt mechanism.

6. An apparatus as claimed in claim 5, further comprising:

means for scanning said specimen with said focused electron beam; and means for displaying a scanning transmission electron microscope image of said specimen by measuring the intensity of said focused electron beam transmitted through respective scanning points on said specimen.

7. An apparatus as claimed in claim 1, further comprising:

means for scanning said specimen with said focused electron beam; and means for displaying the electromagnetic field distribution in said specimen as a scanning image by measuring the directions and the magnitudes of deflection of said optical axis given to said focused electron beam when the focused electron beam is transmitted through respective scanning points on said specimen.

8. An apparatus as claimed in claim 2, wherein said measuring means measures the direction and magnitude of deflection of said focused electron beam for said optical axis at respective scanning points; and wherein said display means displays the electromagnetic field distribution of the specimen derived from the measured direction and magnitude of deflection at the respective scanning points as the scanning transmission electron microscope image.

* * * * *